(12) United States Patent
Lin et al.

(10) Patent No.: US 7,468,551 B2
(45) Date of Patent: Dec. 23, 2008

(54) MULTIPLE CHIPS BONDED TO PACKAGING STRUCTURE WITH LOW NOISE AND MULTIPLE SELECTABLE FUNCTIONS

(75) Inventors: Mou-Shiung Lin, Hsinchu (TW); Bryan Peng, Taoyuan (TW)

(73) Assignee: Megica Corporation, Hsin-Chu (TW)

( * ) Notice: Subject to any disclaimer, the term of this patent is extended or adjusted under 35 U.S.C. 154(b) by 0 days.

(21) Appl. No.: 10/437,333

(22) Filed: May 13, 2003

(65) Prior Publication Data
US 2003/0201545 A1 Oct. 30, 2003

Related U.S. Application Data

(62) Division of application No. 09/573,955, filed on May 19, 2000, now Pat. No. 7,247,932.

(51) Int. Cl.
*H01L 25/065* (2006.01)
*H05K 1/00* (2006.01)
*H05K 1/02* (2006.01)
*H05K 1/14* (2006.01)

(52) U.S. Cl. ............................ 257/686; 257/E25.013; 257/E25.011; 257/E25.03; 257/685; 257/E23.079; 257/777; 257/784; 257/723; 257/738; 257/778; 257/202; 257/204; 257/208; 257/210; 257/280; 257/724; 257/528; 257/532; 257/781; 257/779; 257/786

(58) Field of Classification Search ................ 257/700, 257/701, 758, 686, 685, 723, 777, 778, 737, 257/734, 738, 698, 695, 202, 204, 208, 210, 257/281, 724, 528, 532, E25.013, E25.011, 257/E25.03, 784, 773, 696, 781, 779, 786, 257/E23.079

See application file for complete search history.

(56) References Cited

U.S. PATENT DOCUMENTS 4,598,307 A 7/1986 Wakabayashi et al. ........ 357/75

(Continued)

FOREIGN PATENT DOCUMENTS

JP 4-116858 * 4/1992

OTHER PUBLICATIONS

Co-pending U.S. Patent App. MSLin-98-004C, U.S. Appl. No. 10/420,596, filed Apr. 22, 2003, assigned to the same assignee, "High Performance Sub-System Design and Assembly".

(Continued)

*Primary Examiner*—Alexander O Williams
(74) *Attorney, Agent, or Firm*—Saile Ackerman LLC; Stephen B. Ackerman; Rosemary L. S. Pike

(57) ABSTRACT

A chip package for semiconductor chips is provided by the method of forming a chip package includes the steps of forming a printed circuit board with a window therethrough; forming semiconductor chip connections of one or more primary chips which overlie the window to the printed circuit board by solder connections, locating a suspended semiconductor chip within the window, and connecting the suspended semiconductor chip to one or more primary chips overlying the window in a chip-on-chip connection. A bypass capacitor is formed on the printed circuit board.

14 Claims, 8 Drawing Sheets

U.S. PATENT DOCUMENTS

| | | | | |
|---|---|---|---|---|
| 5,475,262 | A | 12/1995 | Wang et al. | 257/698 |
| 5,498,906 | A | 3/1996 | Roane et al. | 257/724 |
| 5,587,607 | A * | 12/1996 | Yasuda et al. | 257/690 |
| 5,608,262 | A | 3/1997 | Degani et al. | 257/723 |
| 5,789,303 | A | 8/1998 | Leung et al. | 438/381 |
| 5,814,871 | A | 9/1998 | Furukawa et al. | 257/433 |
| 5,818,748 | A | 10/1998 | Bertin et al. | 365/51 |
| 5,854,534 | A | 12/1998 | Beilin et al. | 257/691 |
| 5,898,223 | A | 4/1999 | Frye et al. | 257/777 |
| 5,914,533 | A * | 6/1999 | Frech et al. | 257/700 |
| 5,926,061 | A | 7/1999 | Usui | 327/538 |
| 5,939,782 | A * | 8/1999 | Malladi | 257/698 |
| 5,963,110 | A | 10/1999 | Ihara et al. | 333/28 R |
| 5,977,640 | A | 11/1999 | Bertin et al. | 257/777 |
| 6,180,426 | B1 | 1/2001 | Lin | 438/15 |
| 6,218,729 | B1 * | 4/2001 | Zavrel et al. | 257/698 |
| 6,242,812 | B1 * | 6/2001 | Choi | 257/781 |
| 6,274,931 | B1 * | 8/2001 | Jeon et al. | 257/734 |
| 6,303,996 | B2 | 10/2001 | Lin | 257/777 |
| 6,310,386 | B1 * | 10/2001 | Shenoy | 257/531 |
| 6,335,887 | B1 * | 1/2002 | Aoki et al. | 365/201 |
| 6,356,958 | B1 | 3/2002 | Lin | 710/1 |
| 6,370,013 | B1 * | 4/2002 | Iino et al. | 361/306.3 |
| 6,400,576 | B1 * | 6/2002 | Davidson | 361/763 |
| 6,417,463 | B1 * | 7/2002 | Cornelius et al. | 174/263 |
| 6,498,396 | B1 * | 12/2002 | Arimoto | 257/737 |
| 6,502,161 | B1 * | 12/2002 | Perego et al. | 711/5 |
| 6,525,414 | B2 * | 2/2003 | Shiraishi et al. | 257/686 |
| 6,535,398 | B1 * | 3/2003 | Moresco | 361/792 |
| 6,555,398 | B1 | 4/2003 | Lin | 438/14 |
| 6,566,760 | B1 * | 5/2003 | Kawamura et al. | 257/777 |
| 6,586,266 | B1 | 7/2003 | Lin | 438/15 |
| 6,631,084 | B2 * | 10/2003 | Keeth et al. | 365/51 |
| 6,939,747 | B1 | 9/2005 | Lin | 438/130 |
| 7,051,209 | B1 * | 5/2006 | Brickell | 713/183 |
| 2002/0027773 | A1 * | 3/2002 | Davidson | 361/763 |
| 2002/0185308 | A1 * | 12/2002 | Cornelius et al. | 174/260 |
| 2003/0057544 | A1 * | 3/2003 | Nathan et al. | 257/700 |
| 2003/0067063 | A1 * | 4/2003 | Muff et al. | 257/678 |
| 2003/0201529 | A1 * | 10/2003 | Jeong et al. | 257/698 |
| 2004/0041259 | A1 * | 3/2004 | Yang | 257/724 |
| 2005/0047250 | A1 * | 3/2005 | Ruckerbauer et al. | 365/222 |

OTHER PUBLICATIONS

Co-pending U.S. Patent App. MSLin-98.005 CIP, U.S. Appl. No. 11/181,175, filed Jul. 14, 2005, assigned to the same assignee, "A Multiple Selectable Function Integrated Circuit Module".

Co-pending U.S. Patent App. MSLin-99-001, U.S. Appl. No. 10/385,953, filed Mar. 11, 2003, Assigned to the same assignee, A Software Programmable Multiple Function Integrated Circuit Module.

Takahashi, et al., "3-Dimensional Memory Module", Semi, pp. 166-167, (1997).

* cited by examiner

MULTIPLE CHIPS BONDED TO PACKAGING STRUCTURE WITH LOW NOISE AND MULTIPLE SELECTABLE FUNCTIONS

This application is a division of patent application Ser. No. 09/573,955, filing date May 19, 2000 now U.S. Pat. No. 7,247,932, Multiple Chips Bonded to Packaging Structure with Low Noise and Multiple Selectable Functions, assigned to the same assignee as the present invention. This application is related to application Ser. No. 09/258,911, filed on Mar. 1, 1999, now U.S. Pat. No. 6,180,426; and related to application Ser. No. 09/729,152, filed on Dec. 4, 2000, now U.S. Pat. No. 6,303,996; and related to application Ser. No. 09/849,038, filed on May 4, 2001, now U.S. Pat. No. 6,586,266; and related application Ser. No. 10/420,596, filed on Apr. 22, 2003, now pending; and related to application Ser. No. 09/246,303, filed on Feb. 8, 1999, now U.S. Pat. No. 6,356,958; and related to application Ser. No. 09/961,767, filed on Sep. 21, 2001, now U.S. Pat. No. 6,939,747; and related to application Ser. No. 11/181,175, filed on Jul. 14, 2005, now pending; and related to application Ser. No. 09/422,174, filed on Oct. 22, 1999, now U.S. Pat. No. 6,555,398; and related to application Ser. No. 10/385,953, filed on Mar. 11, 2003, now pending.

BACKGROUND OF THE INVENTION

1. Field of the Invention

This invention relates to packaging structures for integrated circuit chips and more particularly to control of functions thereof.

2. Description of Related Art

U.S. Pat. No. 5,789,303 of Leung et al., assigned to Northern Telecom Limited for "Method of Adding on Chip Capacitors to an Integrated Circuit" shows thin capacitors (100) and (200) deposited on the planarized surface of chips in FIGS. 3 and 4. The capacitor layers are formed by deposition, photolithographic masking, etching, and selective deposition as described at Col. 5. lines 17-50.

U.S. Pat. No. 5,814,871 of Furukawa et al assigned to Fujitsu, Ltd. for "Optical Semiconductor Assembly Having a Conductive Floating Pad" shows a chip capacitor (44) or (in FIG. 4C. thereof formed on the surface of a "metal stem 6" which carries a preamplifier IC (28).

U.S. Pat. No. 5,926,061 of Kawasaki assigned to Fujitsu, for "Power Supply Noise Eliminating Method and Semiconductor Device" shows what appears to be a planar on-chip capacitor C2 on chip (2) in FIG. 24 and described at Col. 10, lines 19-34.

U.S. Pat. No. 5,963,110 of Ihara et al., assigned to Fujitsu, for "Equalizing Filter and Control Method for Signal Equalization" shows a chip capacitor C2T in FIG. 14 bridging a pair of output patterns (P1) and (P2) and described at Col. 7, lines 26-39.

U.S. Pat. No. 4,598,307 of Wakabayashi et al. for "Integrated Circuit Device Having Package with Bypass Calpacitor" shows a bypass capacitor mounted externally in an opening in a marginal area of the lid of a Integrated Circuit (IC) chip package, which is an Dual-In-Line (DIP) type package.

U.S. Pat. No. 5,475,262 of Wang et al. for "Functional Substrates for Packaging Semiconductor Chips" shows stacked multiple levels of interconnected substrates with a separate signal connection substrate, a separate capacitor substrate, a separate resistor substrate, and a separate power supply substrate. Confronting substrates have a plurality of bond pads which are interconnected by inter-substrate contacts between the substrates which may be deformable bumps or other electrical connectors or contacts selected from solder bumps, elastomer bumps and gold bumps.

U.S. Pat. No. 5,498,906 of Roane et al. for "Capacitive Coupling Configuration for an Integrated Circuit Package" shows an externally mounted bypass capacitor for a IC package.

U.S. Pat. No. 5,608,262 of Degani et al. for "Packaging Multi-Chip Modules without Wire-Bond Interconnection" describes at Col. 4, lines 8-11 "a silicon-on-silicon structure having a silicon substrate . . . provided with metallizations to which each chip or die . . . is interconnected in a flip-chip manner by means of solder . . . ." structure in which U.S. Pat. No. 5,854,534 of Bilin et al. for "Controlled Impedance Interposer Substrate" shows an interposer which incorporates a bypass capacitor.

U.S. Pat. No. 5,898,223 of Frye et al. for "Chip-on-Chip Package" shows chip-on-chip packages using solder bump interchip connections as vias between a single level interconnection pattern on the lower support IC chip and another single level interconnection pattern on the upper chip using solder bumps to form connections between the confronting chips.

U.S. Pat. No. 5,939,782 of Malladi shows a "package Construction for an Integrated Circuit Chip with a Bypass Capacitor," buried in a compartment defining an inner chamber in a multilayer substrate formed of a number of generally parallel insulating layers.

U.S. Pat. No. 5,818,748 of Bertin and Cronin for "Chip Function Separation onto Separate Stacked Chips" shows an chips stacked face to face connected together both physically and electrically by FSC's (Force responsive Self-interlocking microConnectors) including confronting pedestals on which FSC's are formed.

U.S. Pat. No. 5,977,640 of Bertin et al for "Highly Integrated Chip-on-Chip Packaging?" shows a chip-on-chip component connection/interconnection for electrically connecting functional chips to external circuitry.

Takahashi et al. "3-Dimensional Memory Module", Semi, pp. 166-167 (1997) shows a stack of flip chips on carriers processed starting with flip chip bonding to a carrier and followed by the steps of epoxy resin casting, polishing, bump formation for stacking, and stacking multiple carriers.

SUMMARY OF THE INVENTION

The invention teaches a methods of mounting discrete chips on a chip package or multi-chip package which may include a bypass capacitor.

An object of this invention is to provide flexibility of functions of multiple chip packages.

Another object of this invention is to provide a separate inventory of products with different functions.

Still another object of this invention is control circuit design in the single chip for example for function selection.

Another object of this invention is to pack a bypass capacitor in package or in combination chip package.

A problem solved by this invention is reduction of the inventory of several products with different functions.

Another object of this invention is to eliminate I/O noise.

A chip package for semiconductor chips is provided by the method of this invention.

In accordance with a first aspect of this invention a method of forming a chip package for a semiconductor chip include the following steps to provide a device in accordance with this invention. Form a printed circuit board having a top surface and a bottom surface including a power structure and a ground structure which are selected from (a) a power bus and a ground bus, and b) a power plane and a ground plane located within the printed circuit board. Form solder connections between the printed circuit board and a chip overlying the printed circuit board in a flip chip connection. Preferably, provide a bypass capacitor with a first terminal and a second terminal, and connect the first terminal of the bypass capacitor to the power structure and connect the second terminal of the bypass capacitor to the ground structure. Juxtapose the capacitor and the power bus and the ground bus with the chip, and connect the first terminal to the power bus or power plane and connect the second terminal to the ground bus or ground plane. Alternatively, locate the capacitor on the opposite surface of the printed circuit board from the chip, and connect the first terminal to the power plane and connect the second terminal to the ground plane. Preferably, connect big solder balls to the opposite surface of the printed circuit board for interconnection thereof with another element.

In accordance with another aspect of this invention a method of forming a chip package for a semiconductor chip and the device produced thereby includes the following steps. Form a first printed circuit board having a top surface and a bottom surface including a power plane and a ground plane located within the first printed circuit board. Form a second printed circuit board having a top surface and a bottom surface. Bond a first chip to the top surface of the first printed circuit board and bond a second chip to the boffom surface of the first printed circuit board in a flip chip connection. Bond a third chip to the bottom surface of the second printed circuit board in a flip chip connection. Bond the chips to the printed circuit boards by means selected solder balls and gold bumps. Provide a bypass capacitor with a first terminal and a second terminal. Connect the first terminal of the bypass capacitor to the power plane. Connect the second terminal of the bypass capacitor to the ground plane. In an alternative feature, bond a fourth chip to the top surface of the second printed circuit board in a flip chip connection. Interconnect the bottom surface of the first printed circuit board and the top surface of the second printed circuit board with big solder balls. Preferably, bond a fourth chip to the second printed circuit board top surface. Provide a bypass capacitor with a first terminal and a second terminal. Connect the first terminal of the bypass capacitor to the power plane and connecting the second terminal of the bypass capacitor to the ground plane.

In accordance with still another aspect of this invention, a method of forming a chip package for semiconductor chips includes the following steps. Form a printed circuit board with a window therethrough having a length and a width and a top surface and a bottom surface. The semiconductor chips include a primary chip and a secondary chip. Form bonded connections between the top surface of the printed circuit board and the primary chip, with the primary chip overlying the window and which extends transversely across the width of the window. Then locate the secondary chip suspended within the window and form bonded connections between the secondary semiconductor chip and the primary chip in a chip-on-chip connection. Preferably, the window has a width less than the length; and the primary chip and the secondary chip have substantially equal chip lengths and substantially equal chip widths. Form the bonded connections of the chips to the printed circuit boards by means selected from solder balls and gold bumps. Preferably, form the bonded connections of the chips to the printed circuit board by means selected from a) solder balls, and b) gold bumps. Form big solder balls on the top surface of the printed circuit board.

In accordance with one more aspect of this invention, a method of forming a chip package for semiconductor chips includes the following steps. Provide a substrate having a top surface and a bottom surface. The semiconductor chips include a primary chip and a secondary chip, the primary chip having a bottom surface and the secondary chip having a top surface. Form bonded chip-on-chip connections between the top surface of the secondary chip and the bottom surface of the primary chip, and form bonded connections between the top surface of the substrate and the primary chip aside from the secondary chip leaving space between the secondary chip and the printed circuit board. The substrate comprises a ball grid array substrate. The bonded connections of the chips to the substrate are provided by means selected from solder balls, and gold bumps. Preferably, form the bonded connections between the top surface of the substrate and the primary chip aside from the secondary chip with big solder balls, the substrate comprising a ball grid array substrate, and the bonded connections of the chips to the substrate being provided by means selected from a) solder balls, and b) gold bumps.

A method of interconnecting semiconductor chips includes steps and the device produced thereby are as follows. There are semiconductor chips including a primary chip and a secondary chip, the primary chip having a top surface and the secondary chip having a bottom surface. Form bonded chip-on-chip connections between the bottom surface of the secondary chip and the top surface of the primary chip. Form bonded connections between the top surface of the primary chip aside from the secondary chip. Preferably, there are bonded connections between the top surface of the primary chip aside from the secondary chip to Tape Automated Bonding (TAB) leads.

A method of forming a chip package for semiconductor chips and the device produced thereby includes the following steps. Form a printed circuit board with a top surface and a window therethrough. Connect two or more primary semiconductor chips each of which only partially overlies the window to the top surface of a printed circuit board by solder bonds. Connect a secondary semiconductor chip located within the window to at least of the two primary chips overlying the window in a chip-on-chip connection. Preferably, connect big solder balls to the top surface of the printed circuit board aside from the primary semiconductor chips.

Finally, another aspect of this invention includes forming a chip package for a semiconductor chip and the product produced thereby by the following steps. Form a printed circuit board having a top surface and a bottom surface including a power structure and a ground structure which include a) a power bus and a ground bus, and b) a power plane and a ground plane located within the printed circuit board. Form solder connections between the printed circuit board and a plurality of chips overlying the printed circuit board in flip chip connections. Provide a bypass capacitor with a first terminal and a second terminal. Connect the first terminal of the bypass capacitor to the power structure and connecting the second terminal of the bypass capacitor to the ground structure. Form optional pads for connection to optional solder balls for functional selection.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1A:
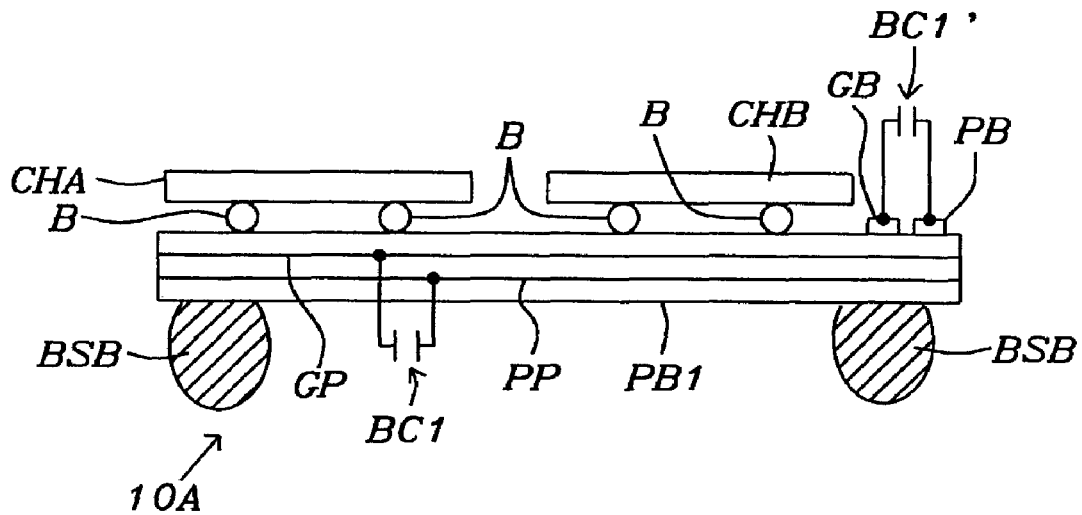
FIGS. 1A, 1B and 1C show Printed Circuit Board onto which two chips and bypass capacitors are connected in various combinations.

FIG. 1A shows a device 10A comprising a first (PCB) Printed Circuit Board PB1 composed of a conventional electrically insulating or dielectric material with a planar upper surface and a planar lower surfaces parallel to each other. On the upper surface of Printed Circuit Board PB1 are two chips CHA and CHB which are connected to the upper surface electrically and mechanically by solder balls SB to conventional pads not shown on the top surface of the printed circuit board PB1. Buried within the printed circuit board PB1 are a conductive ground plane BP and a conductive power plane PP, shown in this example, below the ground plane BP. Both the conductive ground plane BP and the conductive power plane PP are shown to be parallel with the upper and lower surface of the printed circuit board PB1. Modifications of the power plane are possible including multiple levels and variations from simple parallel structures into partially non-parallel arrangements with vias as will be well understood by those skilled in the art.

On the lower surface of the Printed Circuit Board PB1 are shown two big solder balls BSB on either end of the board PB1 which represent an array of big solder balls BSB. The big solder balls BSB are adapted to be connected electrically and mechanically to a supporting element such as another printed circuit board, e.g. a larger circuit board (not shown) as will be well understood by those skilled in the art.

Chips CHA and CHB are attached to the Printed Circuit Board PB1 by the flip-chip method, as will be well understood by those skilled in the art of chip packaging. As indicated above, there are both an internal ground plane GP and an internal power plane PP in the board PB1. That is to say that the ground plane GP and the power plane PP are located internally, buried within the printed circuit board PB1l. A bypass capacitor BC1 which is located below the bottom surface of the printed circuit board PB1 on the exterior of printed circuit board PB1 is connected directly at one end to the internal ground plane GP and is connected directly at the other terminal to the internal power plane PP as seen in FIG. 1A. The big solder balls BSB on the lower surface of the board PB1 provide added clearance for the capacitor BC1. Thus the bypass capacitor BC1 can be located below the exterior of the lower surface of the printed circuit board PB1 and below one or both of the chip CHA and chip CHB because the big solder balls BSB are tall enough to provide clearance for the bypass capacitor BC1 (see FIG. 1A). A ground bus GB and a power bus PB are formed on the top surface of board PB1. Another bypass capacitor BC1' is shown in the right end of the board PB1 with one terminal connected to the ground bus GB and another terminal connected to the power bus PB (see FIG. 1A).

Printed circuit board PB1 is a multi-layer printed circuit board. The small solder balls SB connected to chip CHA and chip CHB are connected to the bio solder balls BSB through the routing of the printed circuits and vias (not shown) on the printed circuit board PB1, as will be well understood by those skilled in the art of chip packaging.

Figure 1B:
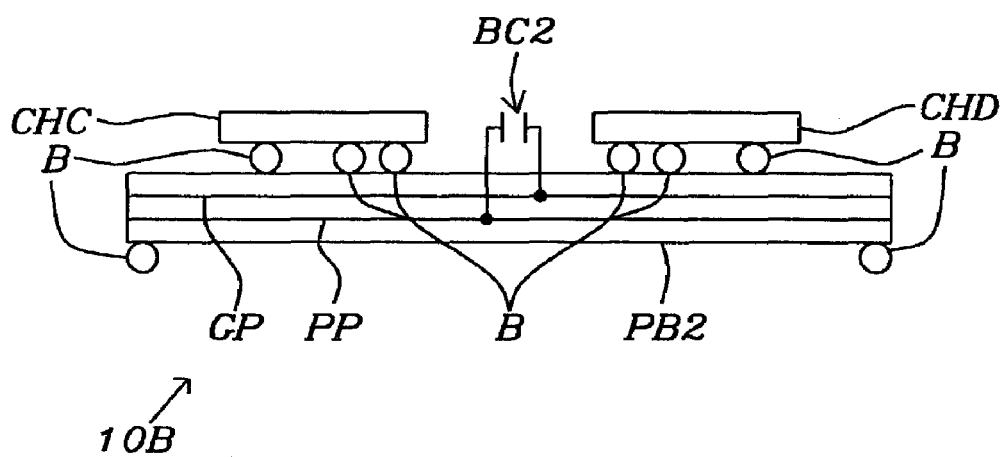

FIG. 1B shows a variation of the device of FIG. 1A comprising a modified device 10B. Device 10B includes a printed circuit board PB2, which is basically the same as board PB1 (FIG. 1A) except that the connection of elements thereto is somewhat different and ground bus GB and power bus PB are omitted. Chip CHC and chip CHD, which are located on the top surface of board PB2, are narrower leaving space to locate the bypass capacitor BC2 therebetween above the exterior of the upper surface of the printed circuit board PB2 in FIG. 1B.

Bypass capacitor BC2 is connected directly at one end to a buried, internal ground plane GP and at the other terminal of the bypass capacitor BC2 is connected directly to a buried, internal power plane PP as described above with respect to FIG. 1A. In this case, the small solder balls SB are located on the bottom of the board PB2 (in place of the big solder balls BSB or FIG. 1A) since there is no need for the extra clearance required in FIG. 1A for location of the bypass capacitor BC1.

Figure 1C:
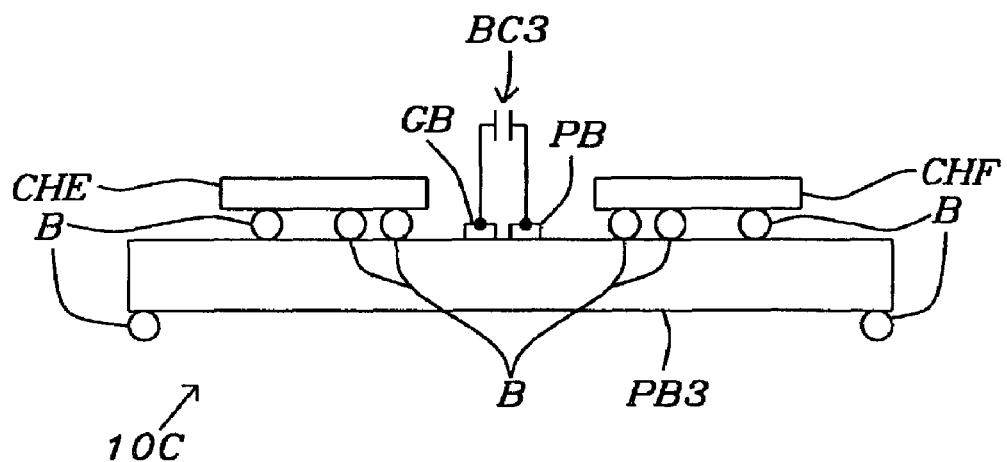

FIG. 1C shows a device 10C which is a modification of the devices 10A of FIG. 1A and 10B of FIG. 1B. The device 10C includes a third printed circuit board PB3, different from the board PB1 of FIG. 1A except that the elements connected thereto are somewhat different. In particular, board PB3 includes no buried ground plane and no buried power plane. Chip CHE and chip CHF, which are located on the top surface of board PB2, are narrower leaving space to locate the bypass capacitor BC2 therebetween on the upper surface of board PB2. Chip CHE and chip CHF, which are located on the top surface of board PB2, are narrower than chips CHA and CHB, leaving space to locate the bypass capacitor BC2 therebetween on the upper surface of board PB3. Bypass capacitor BC3 is connected at one end to the around bus GB and at the other terminal to the power bus PP. In this case, as in FIG. 1B, small solder balls SB are located on the bottom of the board PB2 (in place of the big solder balls BSB or FIG. 1A).

Figure 1D:
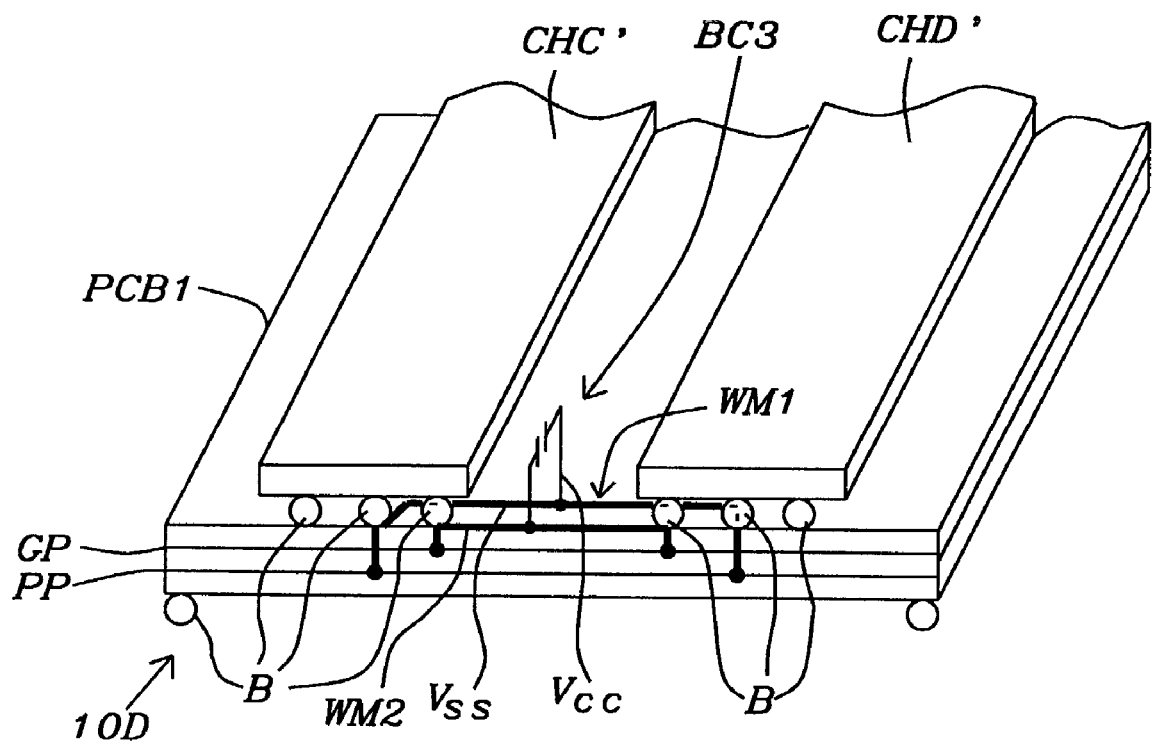
FIG. 1D shows a perspective view of a modification of FIG. 1B.

FIG. 1D shows a perspective view of a modification of FIG. 1B with two chips, chip CHC' and chip CHD' on top of the printed circuit board PCB1 along with the bypass capacitor BC3 shown located above the exterior of the top surface of the printed circuit board PCB1 between chips CHC', CHD'. A wide metal conductor line comprising a power bus WM1 is formed on the surface of the printed circuit board PCB1, as shown in FIG. 1D, connecting to one terminal of the capacitor BC3 and the other wide metal line comprising ground bus WM2 on the surface of the printed circuit board PCB1, connecting to the other terminal of the capacitor BC3. The wide metal line power bus WM1 connects by vias to some solder balls SB in the middle of chips CHC' and CHD' and down to the buried, internal power plane PP, as shown in FIG. 1D. The wide metal line ground bus WM2 connects by other vias to other solder balls SB on the inner edges of chips CHC' and CHD', and down to the buried, internal ground plane GP, as shown in FIG. 1D. Vias are conductors as will be well understood by those skilled in the art.

Figure 2A:
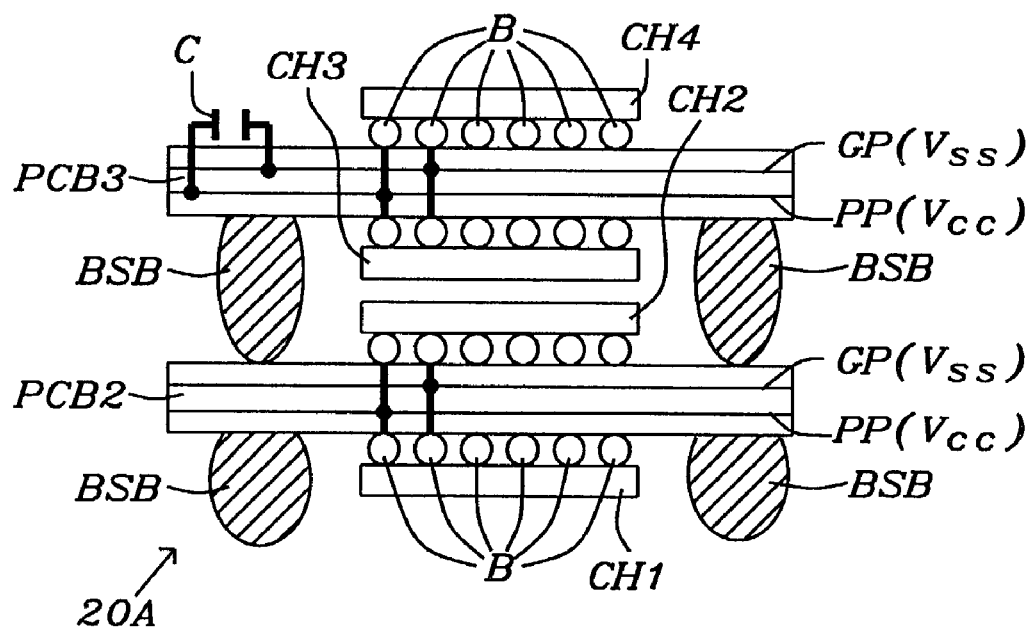
FIG. 2A shows a Printed Circuit Board onto which two chips are connected with one on the top and the other on the bottom and with a capacitor formed on the top of the board.

FIG. 2A shows a device 20A which is a modification of FIG. 1A with two stacked Printed Circuit Boards PCB2 and PCB3 (similar to boards PB1) with an plurality of big solder balls BSB on the periphery of the bottom of the boards PCB2 and PCB3, with a buried, internal ground plane GP at voltage Vss and a buried, internal power plane PP at voltage Vcc as shown and as described above with respect to FIG. 1A. The upper Printed Circuit Board PCB3 is connected to the lower Printed Circuit Board PCB2 by means of several big solder balls BSB which interconnect electrically and mechanically between the lower surface of upper board PCB3 and lower board PCB2 as is well understood by those skilled in the art by means of conductive mounting pads, conductors and vias not shown for convenience of illustration.

Referring to lower Printed Circuit Board PCB2, two chips CH1 and CH2 are supported on the bottom and top respectively of the lower board PCB2. Chips CH1 and CH2 are connected electrically and mechanically by solder balls SB to conventional pads not shown on the bottom surface and top surface of the printed circuit board board PCB2 respectively.

Referring to upper Printed Circuit Board PCB3, two bottom-and-top mounted chips CH3 and CH4 are supported on the bottom and top respectively of lower board PCB2, and chips CH3 and CH4 which are connected electrically and mechanically by solder balls SB to conventional pads not shown on the bottom surface and top surface of the lower printed circuit board board PCB2.

An external bypass capacitor C is formed on the left of the top surface of board PCB3. The externally located bypass capacitor C is shown in FIG. 2A located close to the chips CH3 and CH4. Bypass capacitor also can be mounted on the left upper surface of lower board PCB2. Bypass capacitor C has one terminal shown connected directly to the buried, internal ground plane GP in the upper board PCB3 and at the other terminal shown connected directly to the buried, internal power plane PP in the upper board PCB3. The circuits are similar to those as discussed in FIG. 1B.

Figure 2B:
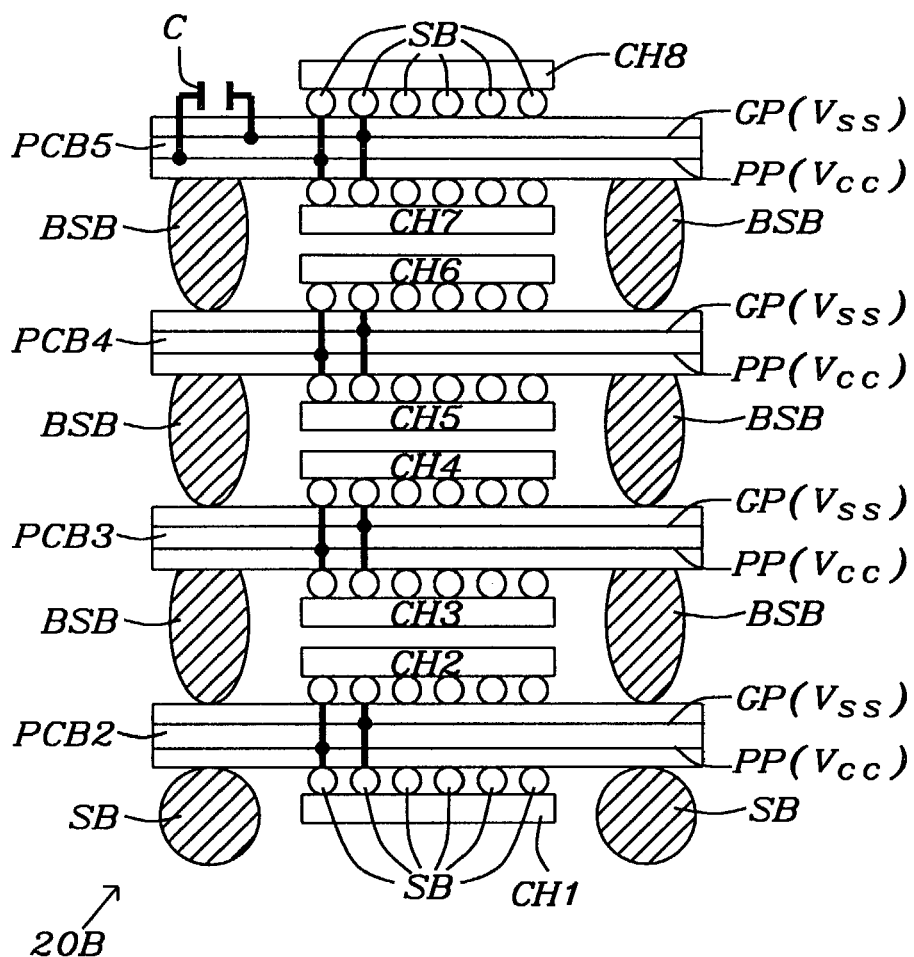
FIG. 2B shows a modification of the device of FIG. 2A which has been expanded to include additional printed circuit boards to which two chips are connected which have been stacked on top of the boards of FIG. 2A.

FIG. 2B shows device 20B which is a modification of the device 20A of FIG. 2A which has been expanded to include several additional printed circuit boards PBC4 and PCB5 which have been stacked on top of upper board PCB3 carrying chips CH5 and CH6 shown mounted bottom-and-top and carrying chips CH7 and CH8 shown mounted bottom-and-top respectively with the big solder balls BSB supporting each printed circuit board, with printed circuit board PCB4 supported on printed circuit board PCB3 and printed circuit board PCB5 supported on printed circuit board PCB4 in like manner to the boards of FIG. 2A. The lower-most printed circuit board PCB2 is shown supported on a moderate size set of enlarged solder balls SB. A bypass capacitor C, which is shown located above the exterior of the top surface of printed circuit board PCB5 at the left end thereof, has one terminal shown connected directly to the buried, internal ground plane GP and is shown connected directly at the other terminal to the buried, internal power plane PP.

Figure 2C:
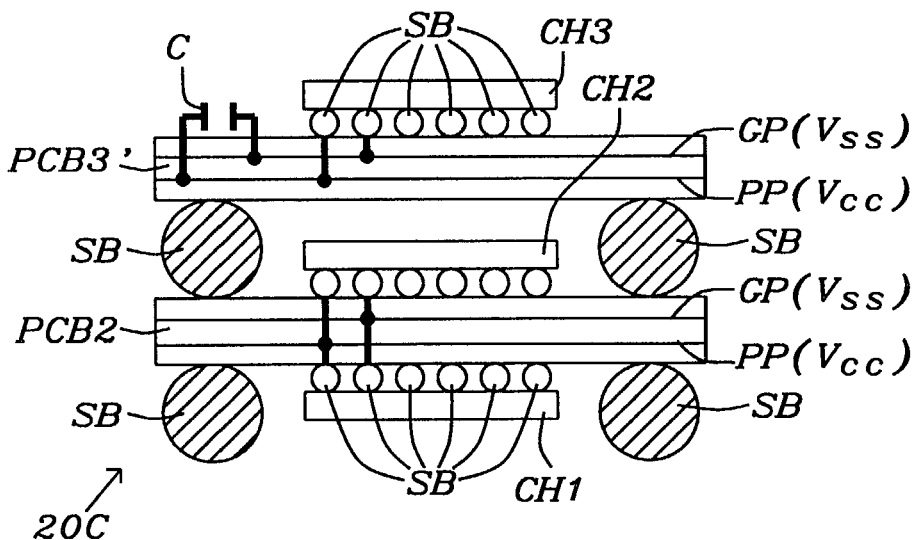
FIG. 2C shows a modification of the device of FIG. 2A which has been modified to include a single chip only on the top of the upper printed circuit board without big solder balls between the upper and tower printed circuit boards.

FIG. 2C shows a modification of the device of FIG. 2A which has been modified to include a chip CH3 on the top of the upper printed circuit board PCB3' without big solder balls between the upper and lower printed circuit boards. In particular, FIG. 2C shows a device 20C which is another modification of the device 20A of FIG. 2A which has been simplified to include top and bottom chips CH1 and CH2 on the lower board PCB2 with a single chip CH3 on the top surface of the upper board PBC3' with smaller solder balls SB interconnecting between the bottom of the upper printed circuit board PCB3' and the top of lower board PCB2 and connected to the bottom of the lower board PCB2. A bypass capacitor C, shown located externally above the top surface of the upper printed circuit board PCB3' at the left end thereof, has one terminal shown connected directly to the buried, internal ground plane GP and at the other terminal is shown connected directly to the buried, internal power plane PP of the upper printed circuit board PCB3'.

Figure 2D:
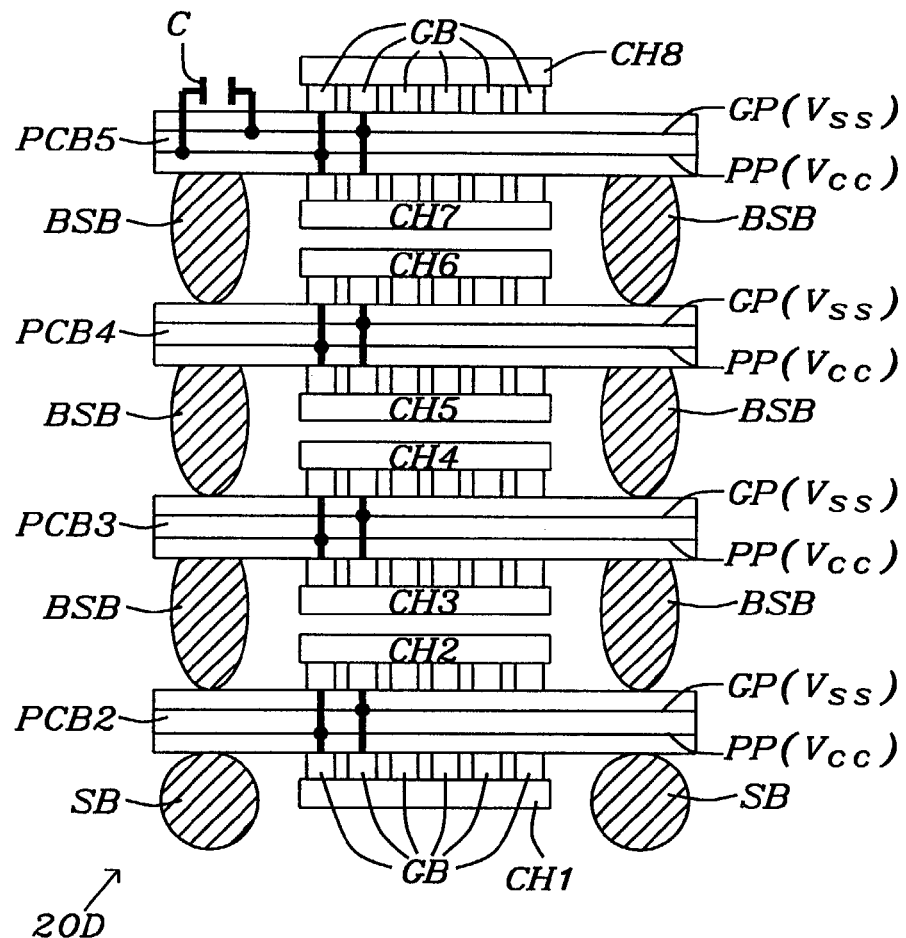
FIG. 2D shows a device which based on FIG. 2B modified to use gold bumps to support the chips to the respective printed circuit boards.

FIG. 2D shows a device 20D which is a modification of the device 20B of FIG. 2B which has been modified to use gold bumps GB to support the chips CH1-CH8 to the respective printed circuit boards PBC2 to PCB5. An external bypass capacitor C is shown located above the top surface of a printed circuit board PCB5 at the left end thereof. The external bypass capacitor C has one terminal shown connected directly to the buried, internal ground plane GP and, as shown, has the other terminal connected directly to the buried, internal power plane PP thereof shown inside the printed circuit board PCB5.

Figure 2E:
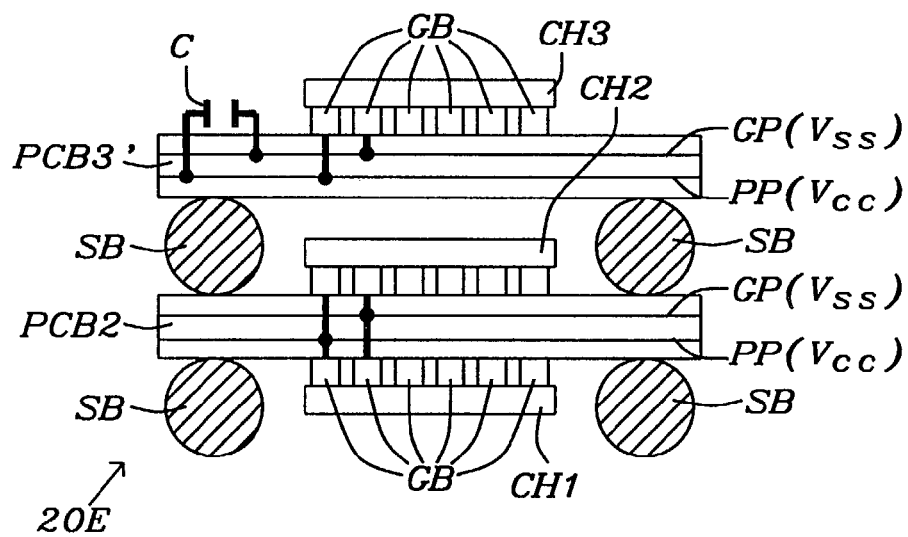
FIG. 2E shows a device 2E which is based on FIG. 2C modified to use gold bumps to support the chips on the respective printed circuit boards.

FIG. 2E shows a device 20E which is another modification of the device 20C of FIG. 2C which has been modified to use gold bumps GB to support the chips CH1-CH3 on the respective lower and upper printed circuit boards PBC2 and PCB3'. An external bypass capacitor C, is shown located above the top surface of the upper printed circuit board PCB3' at the left end thereof, and it has one terminal shown connected directly to the buried, internal ground plane GP and at the other terminal shown connected directly to the buried, internal power plane PP thereof.

Figure 3A:
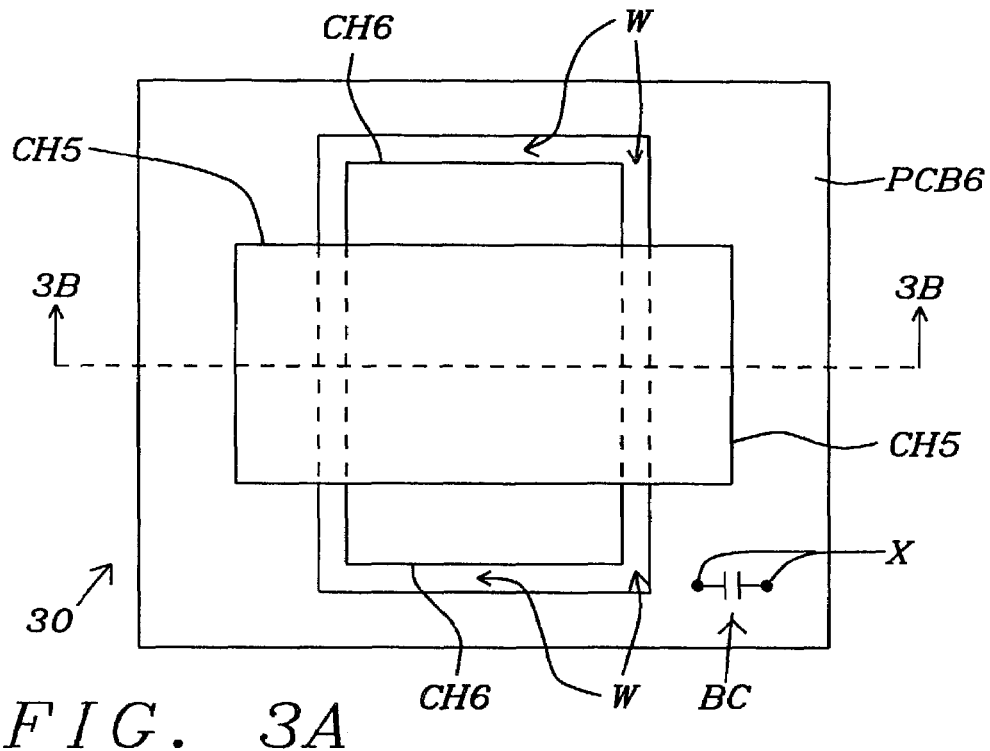
FIG. 3A shows a plan view of a chip-on-chip structure in accordance with this invention where a printed circuit board has a window formed through board in the center with a chip-on-chip) structure with al first chip connected to the board extending across the window and a second chip bonded to the first chip suspended in the window.

FIG. 3A shows a plan view of a chip-on-chip structure in accordance with this invention where a printed circuit board PCB6 has a window W formed therethrough (board PCB6) in the center of FIG. 3A. Window W is shown to have a longer vertical height than the horizontal width. The board PBC6 is the substrate of a Ball Grid Array (BGA) package. A primary, upper chip CH5 is formed above the board PCB6, covering the central portion of window W having its greater length transverse to the window W thereby bridging the window W across the width of the window W. That is to say that primary chip CH5 extends on the left and right beyond window W over board PCB6 across the (narrower) width of the window W. The secondary chip CG16 is supported in a chip-on-chip connected by the lower surface of chip primary CH5. At the same time, secondary chip CH6 is located inside the space provided by window W in the printed circuit board PCB6. The chips CH5 and CH6 are shown to be the same size, i.e. primary chips CH5 is as long and as wide as secondary chip CH6 but they are rotated in orientation by about 90 degrees. A bypass capacitor BC is located on the top surface of printed circuit board PCB6 and as described above, the opposing terminals of capacitor BC are connected to a ground plane GP and the power plane PP, respectively, inside the board PCB6.

Figure 3B:
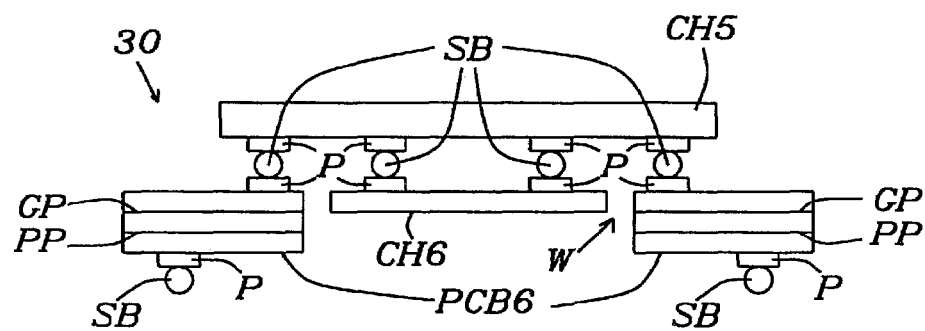
FIG. 3B shows a cross section of the device of FIG. 3A, with external connections on the bottom of the board.

FIG. 3B is a sectional view taken along line 3B-3B in FIG. 3A. In FIG. 3B, the chip-on-chip relationship between primary chip CH5 and secondary chip CH6 is seen. Pads P on the upper surface of secondary chip CH6 are connected electrically and mechanically by solder balls SB to interconnect pads P on the confronting surfaces of the primary, upper chip CH5. In like manner the lower surface of primary chip CH5, aside from secondary chip CH6, is connected to pads P on the upper surface of Printed Circuit Board PCB6. The printed circuit board PCB3 has solder balls SB and pads P located on the lower surface thereof which are adapted to be connected to another circuit board (not shown).

Figure 3C:
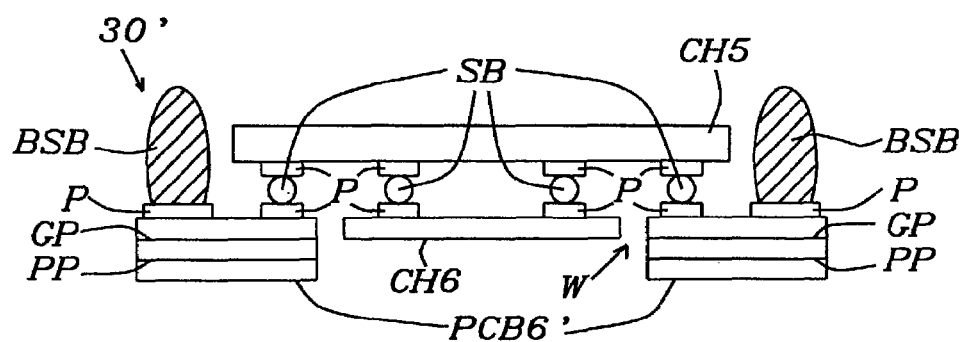
FIG. 3C shows a cross section of the device of FIG. 3A with external connections on the top of the board.

FIG. 3C is a modification of FIG. 3B in which the printed circuit board PCB6' has outboard connection pads P located aside from chip CH5 supporting large solder balls BSB which are adapted to connect the board PCB6' to another circuit board (not shown) as shown by examples in FIGS. 2A, 2B and 2D above.

Figure 3D:
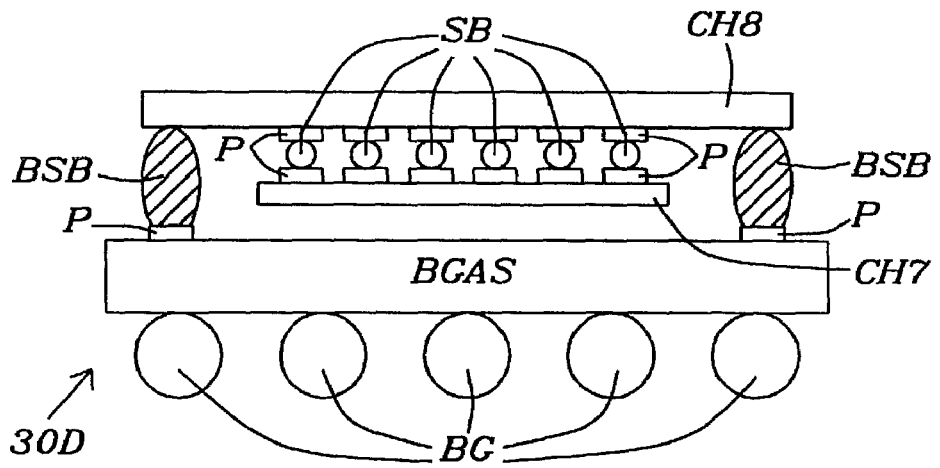
FIG. 3D shows a chip-on-chip structure wherein pads on the top surface of a secondary, chip are bonded to a plurality of solder balls which are also bonded to the bottom of an upper chip that is in turn is carried by a plurality of big solder balls secured to the bottom surface thereof, with the width of the secondary chip being narrower than the length of the upper chip as in FIGS. 3A and 3B, with the big solder balls supported by pads on a ball grid array substrate.

FIG. 3D shows a chip-on-chip structure wherein pads P on the top surface of a lower, secondary chip CH17 is bonded to a plurality of solder balls SB which are also bonded to the bottom of upper, primary chip CH8. In turn chip CH8 is carried by a plurality of big solder balls BSB secured to bottom surface of chip CH8 on the ends thereof with the width of secondary chip CH7 shown in FIG. 3D being narrower than the length of primary chip CH8 as in FIGS. 3A and 3B. In this case, the big solder balls BSB are supported on the bottom ends thereof, below the chips C7 and CH8, by pads P on a ball grid array substrate BGAS which is supported by a grid array of solder balls BG.

Figure 3E:
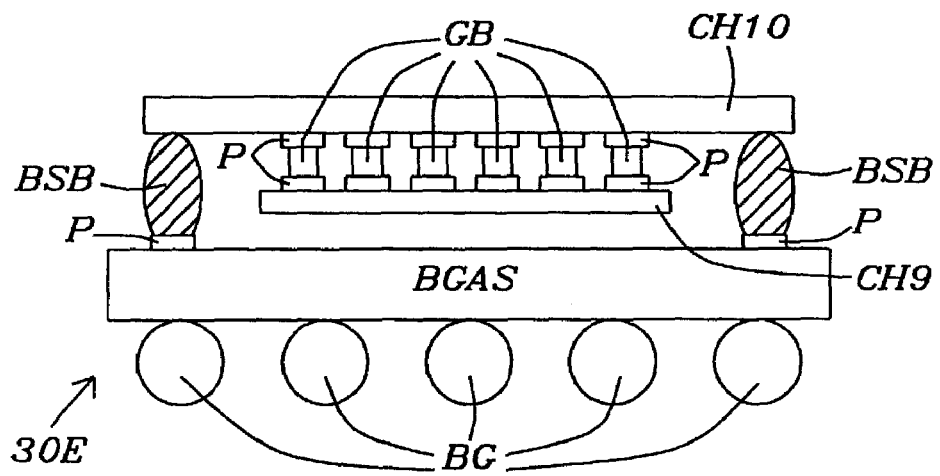
FIG. 3E shows a chip-on-chip structure wherein the pads on the top surface of a secondary chip are bonded to a plurality of gold bumps bonded to pads on the bottom of a primary chip. As in FIG. 3D, the chip is carried by a plurality of big solder balls secured to the bottom surface of a second chip on the ends thereof with the width of first chip being narrower than the length of the second chip as in FIGS. 3A and 3B, with the big solder balls supported by pads on a ball grid array substrate.

FIG. 3E shows a chip-on-chip structure wherein the pads on the top surface of secondary chip C9 is bonded to a plurality of gold bumps GB bonded to pads on the bottom of primary chip CH10. As in FIG. 3D, chip CH10 is carried by a plurality of bio solder balls BSB secured to bottom surface of chip CH10 on the ends thereof with the width of chip CH9 being narrower than the length of chip CH10 as in FIGS. 3A and 3B. In this case, the big solder balls BSB are supported on the bottom ends thereof, below the chips CH7 and CH8, by pads P on a ball grid array substrate BGAS which is supported by a grid array of solder balls BG.

Figure 4:
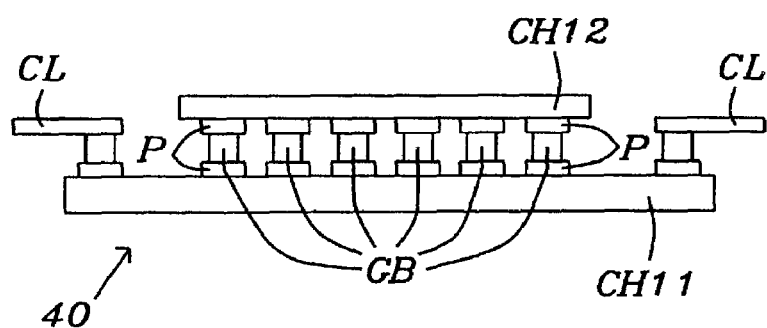
FIG. 4 shows a chip-on-chip interconnection of a primary semiconductor chip and a secondary chip with per peripheral TAB connections to the primary chip.

FIG. 4 shows a chip-on-chip) interconnection of a primary semiconductor chip CH11 and a secondary chip CH12. The primary chip has a top surface which is bonded to („old bonds GB which in turn are bonded to pads P on the bottom surface of the secondary chip CH12 forming chip-on-chip connections between the bottom surface of the secondary chip CH12 and the top surface of the primary chip CH11. On the periphery of the top surface of the primary semiconductor chips gold bond connections are formed aside from tie secondary chip to Tape Automated Bonding (TAB) copper leads CL.

Figure 5A:
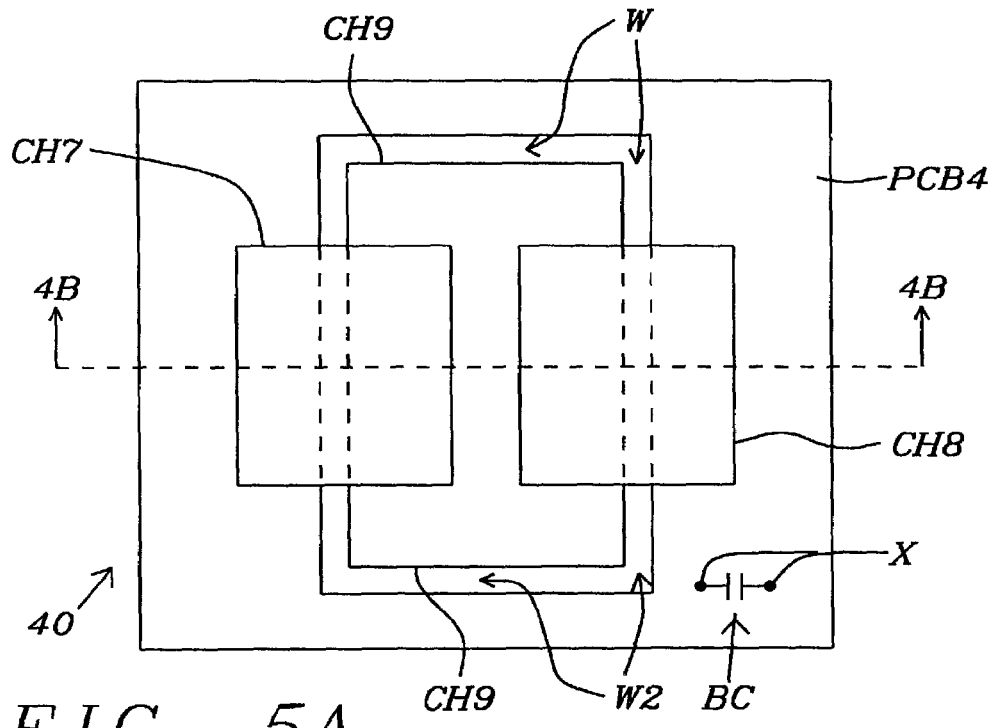
FIG. 5A shows a plan view of a plural chip to single chip chip-on-chip structure in accordance with this invention where a printed circuit board has a window formed through board in the center with a chip-on-chip structure with a first chip connected to the board extending across the window and second and third chips suspended in the window by being bonded to the first chip as in FIG. 3A.

FIG. 5A shows a plan view of a plural chip to single chip chip-on-chip structure in accordance with this invention where a printed circuit board PCB4 has a window W formed through board PCB4 in the center of FIG. 5A. A pair of primacy chips CH7 and CH8 are formed above the printed circuit board PCB4 covering the central portion of window W. On the left, primary chip CH7 extends on the left beyond window W over the top surface board PCB4 to which it is connected by solder balls B and pads P, similarly to the solder bonds described above. On the right, primary chip CH8 extends on the tight beyond window W over board PCB4 to which it is also connected by solder balls B and pads P. A secondary chip CH9 is located below chip CH7 and CH8 inside the window W in the board PCB4. A bypass capacitor BC is located on the top surface of board PCB4. The pads X of bypass capacitor BC are connected to the ground plane GP and the power plane PP as explained in the above described embodiments of this invention.

Figure 5B:
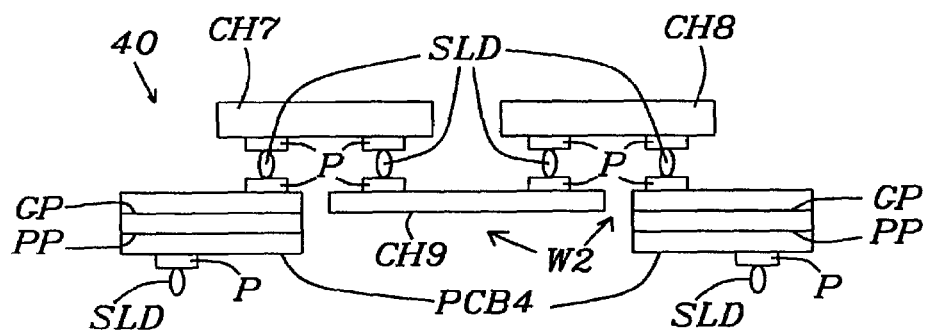
FIG. 5B shows a cross section of the device of FIG. 5A with external solder ball connections on the bottom of the board.

FIG. 5B is a sectional view taken along line 4B-4B in FIG. 5A. In FIG. 5B, it is seen that connection pads P on the upper surface of chip CH9 are bonded by solder balls SLD electrically and mechanically to interconnect pads P on the confronting surfaces of upper chips CH7/CH8. In like manner the lower surfaces of chips CH7/CH8, aside from chip CH9, are connected to pads P on the upper surface of Printed Circuit Board PCB4. For external connections, the printed circuit board PCB4 has outboard solder balls S13 and pads P located on the lower surface thereof which are adapted to be connected to another circuit board (not shown). Board PCB4 is a substrate of a BGA type package.

Figure 5C:
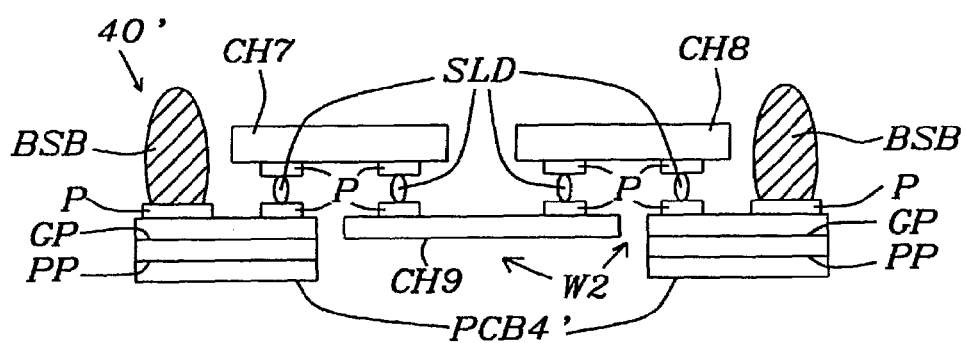
FIG. 5C shows a cross section of the device of FIG. 5A with external big solder ball connections on the top of the board.

FIG. 5C is a slight modification of FIG. 5B in which outboard connection pads P and big solder balls BSB has been added to the top surface of printed circuit board PCB4'. The big solder balls BSB on the top surface of the board PCB4', which are available for external connections, are located aside from chips CH7 and CH8 with big solder balls BSB which are adapted to connect the board PCB4' to another circuit board (not shown).

Figure 6:
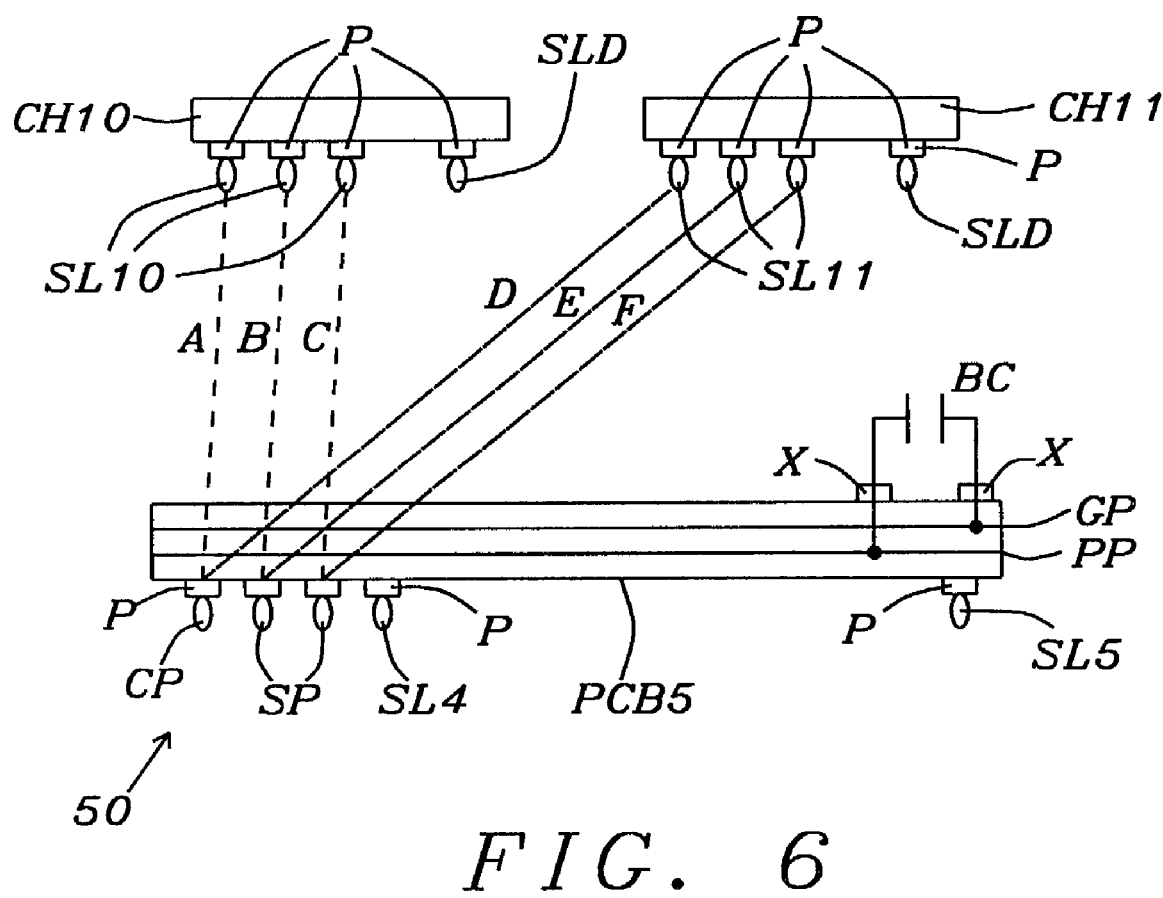
FIG. 6 shows a sectional view of a circuit board which has a number of pads to which one control pin solder terminal, two selection pin solder terminals, and other solder terminals are connected. Two chips are shown connected by dotted lines between the pads on the circuit board and pins on the bottom of the chips.

FIG. 6 shows a sectional view of a circuit board PCB5 which has a number of pads P to which one solder pin CP, two solder pin SP, and two solder pins SL4 and SL5 are connected respectively as shown. The solder in CP functions as a control pin. The solder pins SP function as selection pins. Chips CH10 and C11 are shown connected by dotted lines ABC and DEF between the pads for pins CP and SP and pins SL10 and SL11 on pads P on the bottom of chips CH10 and CH11 respectively. Additional bumps SLD are also connected to the chips by bonding to pads P. An external bypass capacitor BC is shown located above the top surface of the circuit board PCB5. The pads X of the external bypass capacitor BC are shown to be connected to the circuit board PCB5 with one pad X shown being connected directly to the buried, internal ground plane GP and with the other pad X shown being connected directly to the buried, internal power plane PP as explained in the above described embodiments of this invention. The control solder pin CP is electrically connected to a pin SL10 formed on the chip CH10 and a pin SL11 formed on the chip CH11, by the connections represented by the dotted line A and the dotted line D, respectively. The selection solder balls SP are electrically connected to the respective pins SL10 formed on the chip CH10, by the connections represented by the dotted lines B and C, and to the respective pins SL11 formed on the chip CH11, by the connections represented by the dotted lines E and F.

The meaning of the dotted lines ABC and DEF in FIG. 6 indicate the connection of the control pin CP and the selection solder pin SP of board PCB5 to the respective control solder pins and the selection solder pins of chips CH10 and CH11. Chips CH10 and CH11 are connected to the board PCB5 by the flip-chip method. The control solder pins of chips CH10 and CH11 are connected to the control solder pin CP of board PCB5 through first interconnection metal lines of board PCB5. The selection solder pins of chips CH10 and CH11 are connected to the selection solder pin SP of board PCB5 through other interconnection metal lines of board PCB5.

EXAMPLE OF APPLICATION

If there are two chips with x4, x8, and x16 option packages in one die, then this die can be x4, x8, x16 or x32.

The meaning of the x4 option is that the width of the data is 4 bits in an integrated circuit memory.

FIG. 6 shows the inventive concept that optional functions can be provided in a multiple chip package made in accordance with this invention. In the prior art, optional functions are possible only on a single chip level, whereas with the configuration shown in FIG. 6 and previous drawings, the function of a chip can be fixed after completion of the packaging process.

FIG. 6 and the embodiments from FIG. 1A to FIG. 4C and FIG. 5A all have a bypass capacitor. All of the printed circuit boards include a ground plane and a power plane. The bypass capacitors are connected between the ground plane and the power plane. The pad options illustrated by FIG. 6 can be employed in the embodiments from FIG. 1A to FIG. 4C.

SUMMARY

A bonding option for a multiple chip package is provided.

Methods of mounting discrete chips on a chip package or multi-chip package which may include a bypass capacitor, a ground plane and a power plane.

Flexibility of functions of a multiple chip packages is enhanced.

There is a separate inventory of products with different functions.

A control circuit design in the single chip provides for function selection.

The bypass capacitor is packed in a package or in combination chip package. The bypass capacitor is connected to the ground plane and the power plane of the substrate of the package. A big solder ball is employed for packages when the bypass capacitor is located on the same surface with the solder balls which are adapted to be connected to another circuit board.

A problem solved by this invention is reduction of the inventory of several products with different functions.

This invention serves to eliminate I/O noise.

While this invention has be-en described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A chip package comprising:
a circuit component;
a first chip connected to said circuit component, wherein said first chip has multiple first bit-width options, wherein said multiple first bit-width options comprise a x8 option;
multiple first metal bumps connecting said first chip to said circuit component, wherein said first chip is connected to said circuit component in a flip-chip assembly; and
a second chip connected to said circuit component, wherein said second chip has multiple second bit-width options.

2. The chip package of claim 1, wherein said circuit component comprises a substrate.

3. The chip package of claim 1 further comprising multiple second metal bumps connecting said second chip to said circuit component, wherein said second chip is connected to said circuit component in a flip-chip assembly.

4. The chip package of claim 1, wherein said multiple first bit-width options further comprise a x4 option.

5. The chip package of claim 1, wherein said multiple second bit-width options comprise a x4 option.

6. The chip package of claim 1, wherein said multiple second bit-width options comprise a x8 option.

7. The chip package of claim 1, wherein said multiple first bit-width options further comprise a x16 option.

8. The chip package of claim 1 wherein said multiple second bit-width options comprise a x16 option.

9. The chip package of claim 1 further comprising a capacitor over said circuit component.

10. The chip package of claim 9, wherein said capacitor comprises a first terminal connected to a power plane of said circuit component and a second terminal connected to a ground plane of said circuit component.

11. The chip package of claim 1, wherein said circuit component comprises a control terminal connecting said first and second chips.

12. The chip package of claim 11, wherein said control terminal comprises solder.

13. The chip package of claim 1, wherein said circuit component comprises a selection terminal connecting said first and second chips.

14. The chip package of claim 13, wherein said selection terminal comprises solder.

* * * * *